(12) United States Patent
Morita et al.

(10) Patent No.: US 10,559,955 B2
(45) Date of Patent: Feb. 11, 2020

(54) ELECTROSTATIC SURGE PREVENTION STRUCTURE

(71) Applicant: CLARION CO., LTD., Saitama (JP)

(72) Inventors: Shinji Morita, Saitama (JP); Sachiko Toshimori, Saitama (JP); Yuichi Kaneko, Saitama (JP); Yuji Adachi, Saitama (JP)

(73) Assignee: Clarion, CO., LTD., Saitama-shi (JP)

( * ) Notice: Subject to any disclaimer, the term of this patent is extended or adjusted under 35 U.S.C. 154(b) by 374 days.

(21) Appl. No.: 15/317,254

(22) PCT Filed: May 28, 2015

(86) PCT No.: PCT/JP2015/065373
§ 371 (c)(1),
(2) Date: Dec. 8, 2016

(87) PCT Pub. No.: WO2016/013292
PCT Pub. Date: Jan. 28, 2016

(65) Prior Publication Data
US 2017/0141566 A1    May 18, 2017

(30) Foreign Application Priority Data

Jul. 22, 2014 (JP) ................................. 2014-148466

(51) Int. Cl.
*H02H 9/04* (2006.01)
*H05F 3/02* (2006.01)
(Continued)

(52) U.S. Cl.
CPC ............ *H02H 9/045* (2013.01); *B60R 16/02* (2013.01); *H05F 3/02* (2013.01); *H05K 1/028* (2013.01);
(Continued)

(58) Field of Classification Search
CPC .......... H05K 1/028; H05K 1/147; H05F 3/02; H02H 9/045
See application file for complete search history.

(56) References Cited

U.S. PATENT DOCUMENTS

| 6,628,268 B1 | 9/2003 | Harada et al. |
| 2009/0011197 A1 | 1/2009 | Matsuhira |

(Continued)

FOREIGN PATENT DOCUMENTS

| CN | 2648764 Y | 10/2004 |
| CN | 201788332 U | 4/2011 |

(Continued)

OTHER PUBLICATIONS

TW 102144928. Dec. 6, 2013. (Year: 2013).*

(Continued)

*Primary Examiner* — Thienvu V Tran
*Assistant Examiner* — Christopher J Clark
(74) *Attorney, Agent, or Firm* — IP Business Solutions, LLC

(57) ABSTRACT

There is provided an electrostatic surge prevention structure capable of improving resistance against electrostatic surge, reducing costs and processes, and saving spaces. A flexible printed circuit board 31 connected to a control printed circuit board contained in a front casing 22 is provided at a position corresponding to a gap 41, between the front casing 22 and a touch panel assembly 21, appearing in a display device 12, the flexible printed circuit board 31 has two layers of conductor parts 43 and 44, surfaces of these conductor parts 43 and 44 are covered with insulative coats 46 and 47, an exposed part 44A (or coating part 51 by plating as the exposed part) through which the conductor part 44 is externally exposed is formed at a portion opposing the gap 41 by peeling off the insulative coat 47, and the conductor part 44

(Continued)

having the exposed part 44A (or coating part 51) is grounded.

4 Claims, 5 Drawing Sheets

(51) Int. Cl.
*H05K 1/02* (2006.01)
*H05K 1/14* (2006.01)
*B60R 16/02* (2006.01)
*H05K 5/00* (2006.01)
*H05K 9/00* (2006.01)
*B60K 35/00* (2006.01)

(52) U.S. Cl.
CPC .......... *H05K 1/147* (2013.01); *H05K 5/0017* (2013.01); *B60K 35/00* (2013.01); *B60K 2370/1438* (2019.05); *B60K 2370/42* (2019.05); *H05K 9/00* (2013.01)

(56) References Cited

U.S. PATENT DOCUMENTS

| | | | |
|---|---|---|---|
| 2014/0174796 A1 | 6/2014 | Watanabe | |
| 2014/0285982 A1* | 9/2014 | Kim | H05K 1/028 361/749 |
| 2015/0160749 A1* | 6/2015 | Hsieh | G06F 1/1626 345/173 |

FOREIGN PATENT DOCUMENTS

| | | |
|---|---|---|
| CN | 202121863 U | 1/2012 |
| CN | 103594022 A | 2/2014 |
| CN | 103906343 A | 7/2014 |
| JP | 2001-43022 A | 2/2001 |
| JP | 2005-049774 A | 2/2005 |
| JP | 2009-158808 A | 7/2009 |

OTHER PUBLICATIONS

Notice of Reasons for Refusal mailed by China Patent Office dated Sep. 4, 2017 in the corresponding Chinese patent application No. 2015800350991.
Extended European Search Report dated by the European Patent Office dated Mar. 13, 2018 in the corresponding European patent application No. 15823941.8-1203.
Japanese Office Action mailed by Japanese Patent Office dated Apr. 10, 2018 in the corresponding Japanese patent application No. 2014-148466.
International Preliminary Report on Patentability issued for corresponding PCT/JP2015/065373.
Written Opinion of the International Searching Authority issued for corresponding PCT/JP2015/065373.
International Search Report issued for corresponding PCT/JP2015/065373 application.
Written Opinion of the International Search Authority issued for corresponding PCT/JP2015/065373 application.

\* cited by examiner

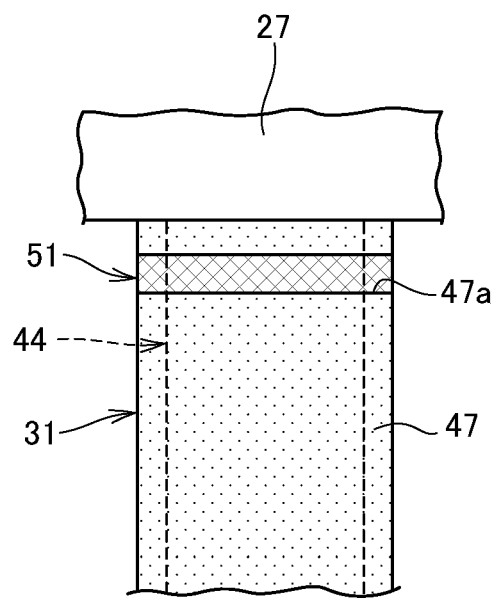 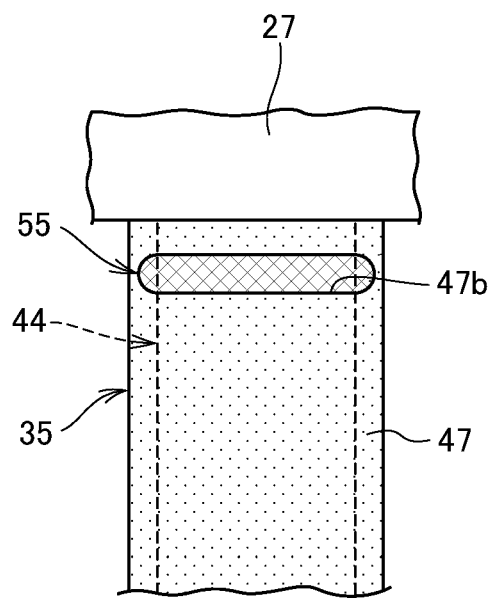

ELECTROSTATIC SURGE PREVENTION STRUCTURE

TECHNICAL FIELD

The present invention relates to electrostatic surge prevention structure capable of allowing static electricity coming in through a gap in a casing of an in-vehicle device to escape to ground and preventing electrostatic surge from occurring.

BACKGROUND ART

Conventionally, there is known an in-vehicle display device including a structure for absorbing unwanted radiation noise (for example, see Patent Literature 1).

A circuit board part is formed on a glass substrate of a liquid crystal display panel in a display device, and a display control device is connected to a driver IC provided in the circuit board part via a flexible printed circuit board. A shielding metal foil is pasted on the flexible printed circuit board, a metal foil tape is pasted on the shielding metal foil, and moreover, the metal foil tape is pasted on a frame body of the liquid crystal display device. Thereby, the shielding metal foil is electrically connected to the frame body via the metal foil tape, and thus, the structure for absorbing radiation noise generated from the flexible printed circuit board is formed.

CITATION LIST

Patent Literature

Patent Literature 1: Japanese Patent Laid-Open No. 2005-49774

SUMMARY OF INVENTION

Technical Problem

With the technology of Patent Literature 1, static electricity, for example, generated on the liquid crystal display panel side can also be not to come inside the liquid crystal display device and not to damage an IC included in the display control device or the like. The static electricity can be allowed to escape to the frame body which is the ground side via the shielding metal foil and the metal foil tape.

However, resistance against electrostatic surge is wanted to be improved as a structure for more easily allowing static electricity to escape. Moreover, since in Patent Literature 1, the shielding metal foil and the metal foil tape are used, the number of components increases to increase costs, and an arrangement space is needed to be secured. Moreover, processes for cleaning and degreasing the portions where the shielding metal foil and the metal foil tape are pasted increase.

The present invention is devised in view of the aforementioned circumstances and an object thereof is to provide an electrostatic surge prevention structure capable of improving resistance against electrostatic surge, reducing costs and processes, and saving spaces.

Solution to Problem

This specification includes the entire contents of Japanese Patent Application No. 2014-148466 filed on Jul. 22, 2014.

In order to solve the aforementioned problem, the present invention is characterized in that a flexible printed circuit board connected to a circuit board contained in an electronic device is provided at a position corresponding to a gap, between two members, appearing in the electronic device, and the flexible printed circuit board has two layers of conductor parts, surfaces of these conductor parts are covered with insulative coats, an exposed part through which one of the conductor parts is externally exposed is formed at a portion opposing the gap by peeling off the insulative coat, and the conductor part having the exposed part is grounded.

According to this configuration, static electricity coming into the electronic device through the gap can be allowed to escape to the ground via the exposed part, and electrostatic surge can be prevented from occurring. Since static electricity is allowed to escape using the conductor part of the existing flexible printed circuit board, a structure for preventing electrostatic surge or processes or spaces for providing the structure are not particularly needed but resistance against electrostatic surge can be improved while costs and processes are reduced and spaces are saved.

In the aforementioned configuration, the exposed part may be provided at a position closer to the gap than a connecting part provided in an end part of the flexible printed circuit board. According to this configuration, by providing the exposed part at the position closer to the gap, static electricity can easily reach the exposed part from the gap, and electrostatic surge can be prevented from occurring.

Moreover, in the aforementioned configuration, the exposed part may undergo plating with conductivity. According to this configuration, the plating can prevent corrosion of the exposed part.

Moreover, in the aforementioned configuration, the two members may be constituted of a front casing constituting a front part of the electronic device for being implemented in a vehicle, and a touch panel attached to the front casing, and the flexible printed circuit board may connect the touch panel to a touch panel control circuit provided in the circuit board. According to this configuration, electrostatic surge due to static electricity flowing from an occupant operating the touch panel can be prevented from occurring, and damage to an IC or the like of the touch panel control circuit can be prevented.

Advantageous Effects of Invention

In the present invention, a flexible printed circuit board connected to a circuit board contained in an electronic device is provided at a position corresponding to a gap, between two members, appearing in the electronic device, and the flexible printed circuit board has two layers of conductor parts, surfaces of these conductor parts are covered with insulative coats, an exposed part through which one of the conductor parts is externally exposed is formed at a portion opposing the gap by peeling off the insulative coat, and the conductor part having the exposed part is grounded. Hence, static electricity coming into the electronic device through the gap can be allowed to escape to the ground via the exposed part, and electrostatic surge can be prevented from occurring. Since static electricity is allowed to escape using the conductor part of the existing flexible printed circuit board, a structure for preventing electrostatic surge or processes or spaces for providing the structure are not particularly needed but resistance against electrostatic surge can be improved while costs and processes are reduced and spaces are saved.

BRIEF DESCRIPTION OF DRAWINGS

FIGS. 5A and 5B are explanatory drawings showing positions and shapes of coating parts in flexible printed circuit boards. FIG. 5A is a diagram showing a coating part of a first embodiment. FIG. 5B is a diagram showing a coating part of a second embodiment.

DESCRIPTION OF EMBODIMENTS

Hereafter, embodiments of the present invention are described with reference to the drawings.

Figure 1:
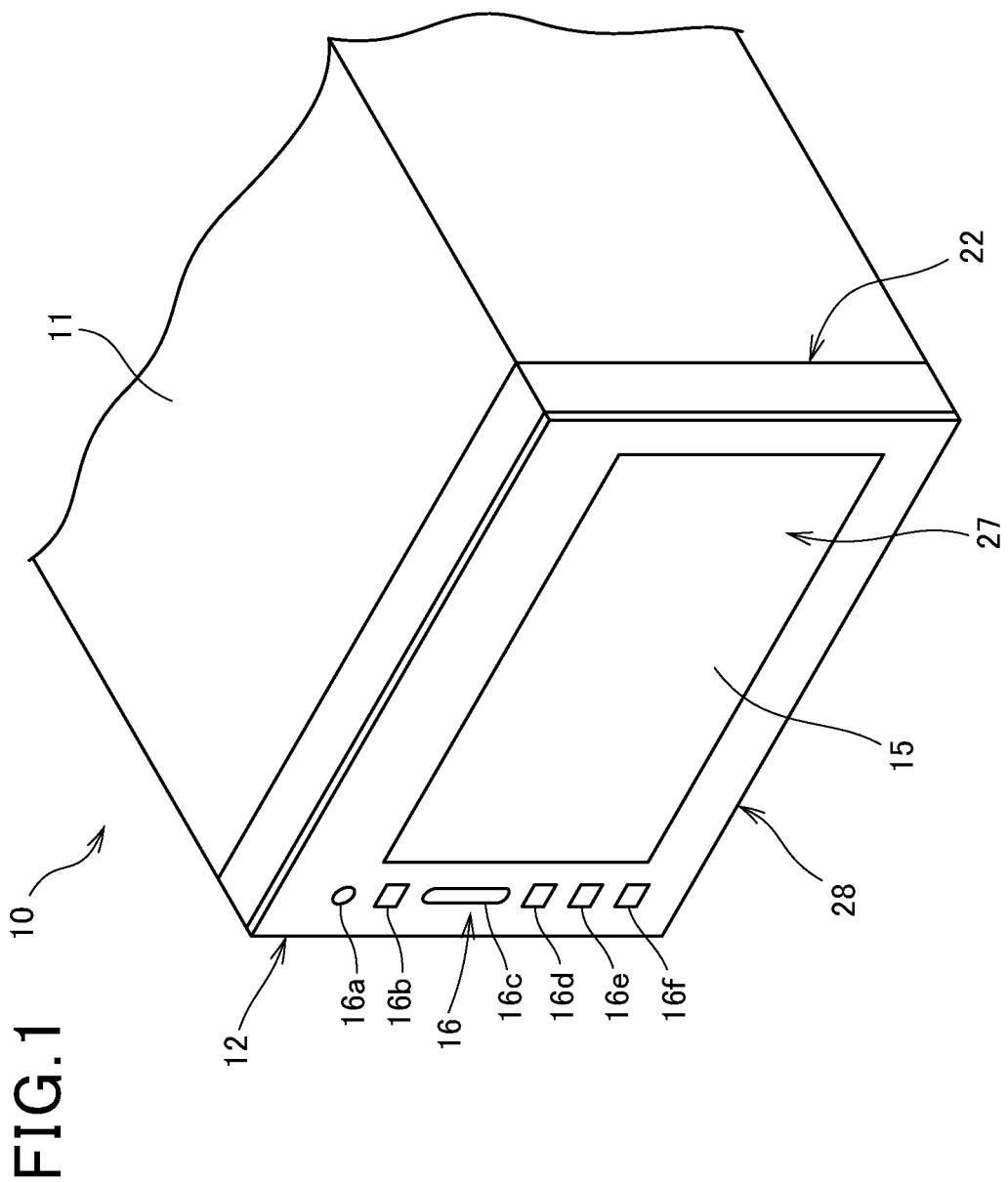
FIG. 1 is a perspective view of an in-vehicle device employing an electrostatic surge prevention structure of the present invention.

FIG. 1 is a perspective view of an in-vehicle device 10 employing an electrostatic surge prevention structure of the present invention.

The in-vehicle device 10 includes a substantially rectangular solid-shaped device main body 11 and a display device 12 which is provided on the front side of the device main body 11 and can be operated through touch operation.

The in-vehicle device 10 is an in-vehicle electronic device such as an audio device playing back CDs, DVDs and the like and a navigation device searching for paths to designated destinations, and is implemented by being embedded in an accommodation space provided on an instrument panel or the like of a vehicle.

The display device 12 includes a touch screen 15 undergoing input operation by touching an arbitrary position thereon with a finger, and a touch switch part 16 for performing predetermined operations by touching predetermined positions thereon with a finger.

The touch switch part 16 includes a plurality of touch switches 16a, 16b, 16c, 16d, 16e and 16f.

Figure 2:
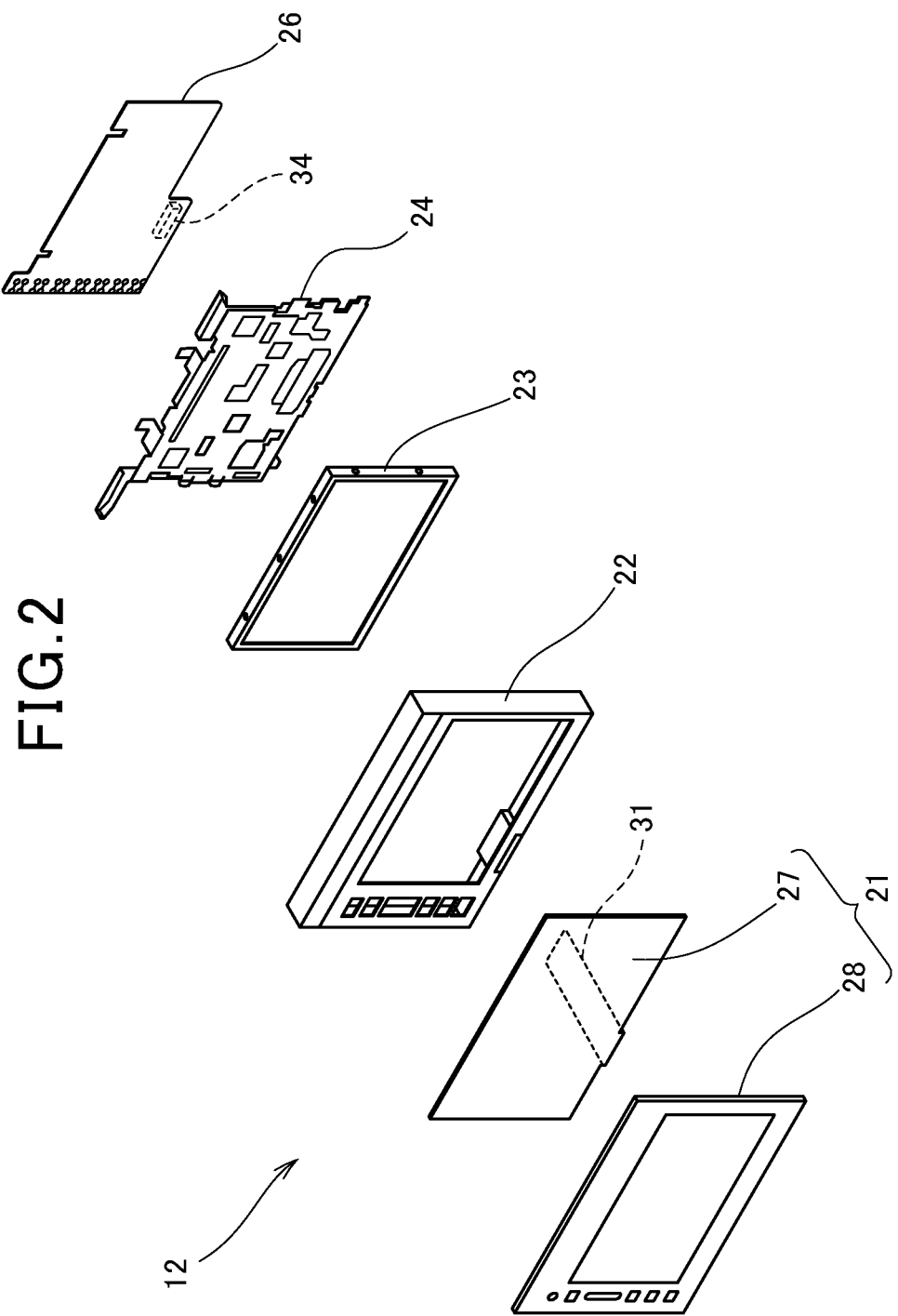
FIG. 2 is an exploded perspective view showing a display device.

FIG. 2 is an exploded perspective view showing the display device 12.

The display device 12 includes a touch panel assembly 21, a front casing 22, a liquid crystal module 23, a liquid crystal holder 24 and a control printed circuit board 26 in the order from the front side.

The touch panel assembly 21 includes a touch panel 27 and a decorative panel 28 pasted on the front face of the touch panel 27. The touch panel 27 is a panel which is overlapped and disposed on the front face of the liquid crystal module 23 and employs a touch detection system such as a resistance film system and a capacitance system, and undergoes predetermined input operation by touching representation on a liquid crystal screen of the liquid crystal module 23. The decorative panel 28 forms the touch screen 15 and the touch switch part 16 by being pasted on the front face of the touch panel 27, and moreover, covers the pattern of a drive circuit formed in a periphery part of the touch panel 27.

In the front casing 22 which is made of resin, onto the front face thereof, the touch panel assembly 21 is attached, and in the interior thereof, the liquid crystal module 23, the liquid crystal holder 24 and the control printed circuit board 26 are contained.

The liquid crystal module 23 is constituted of a liquid crystal display, a drive circuit board driving the liquid crystal display, a backlight, and the like. The liquid crystal holder 24 retains the liquid crystal module 23 and is attached to the front casing 22. The control printed circuit board 26 is a circuit board having a touch panel control circuit disposed close to the liquid crystal holder 24.

Figure 3:
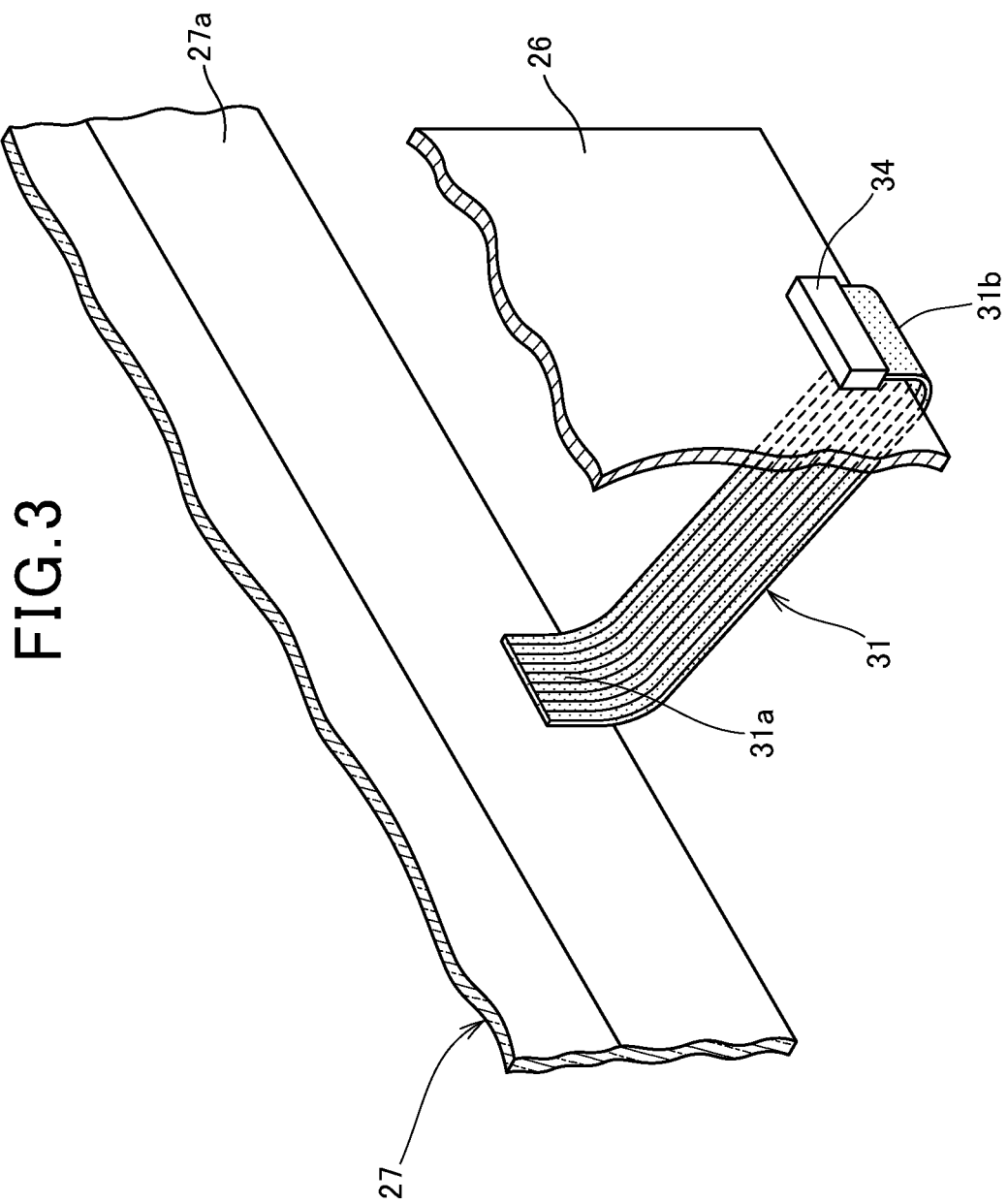
FIG. 3 is a perspective view showing a flexible printed circuit board and its periphery.

FIG. 3 is a perspective view showing a flexible printed circuit board 31 and its periphery.

On an edge part of the rear face of the touch panel 27, a pattern formed part 27a in which a conductive wire pattern for outputting information of a touched position is formed is provided. Onto the pattern formed part 27a, one end part 31a of the flexible printed circuit board 31 is connected by bonding.

In the flexible printed circuit board 31, the other end part 31b thereof is detachably connected to a connector 34 provided on the control printed circuit board 26. Thereby, a signal corresponding to the touch position is sent from the touch panel 27 to the control printed circuit board 26 via the flexible printed circuit board 31, and the touch position is specified.

Figure 4:
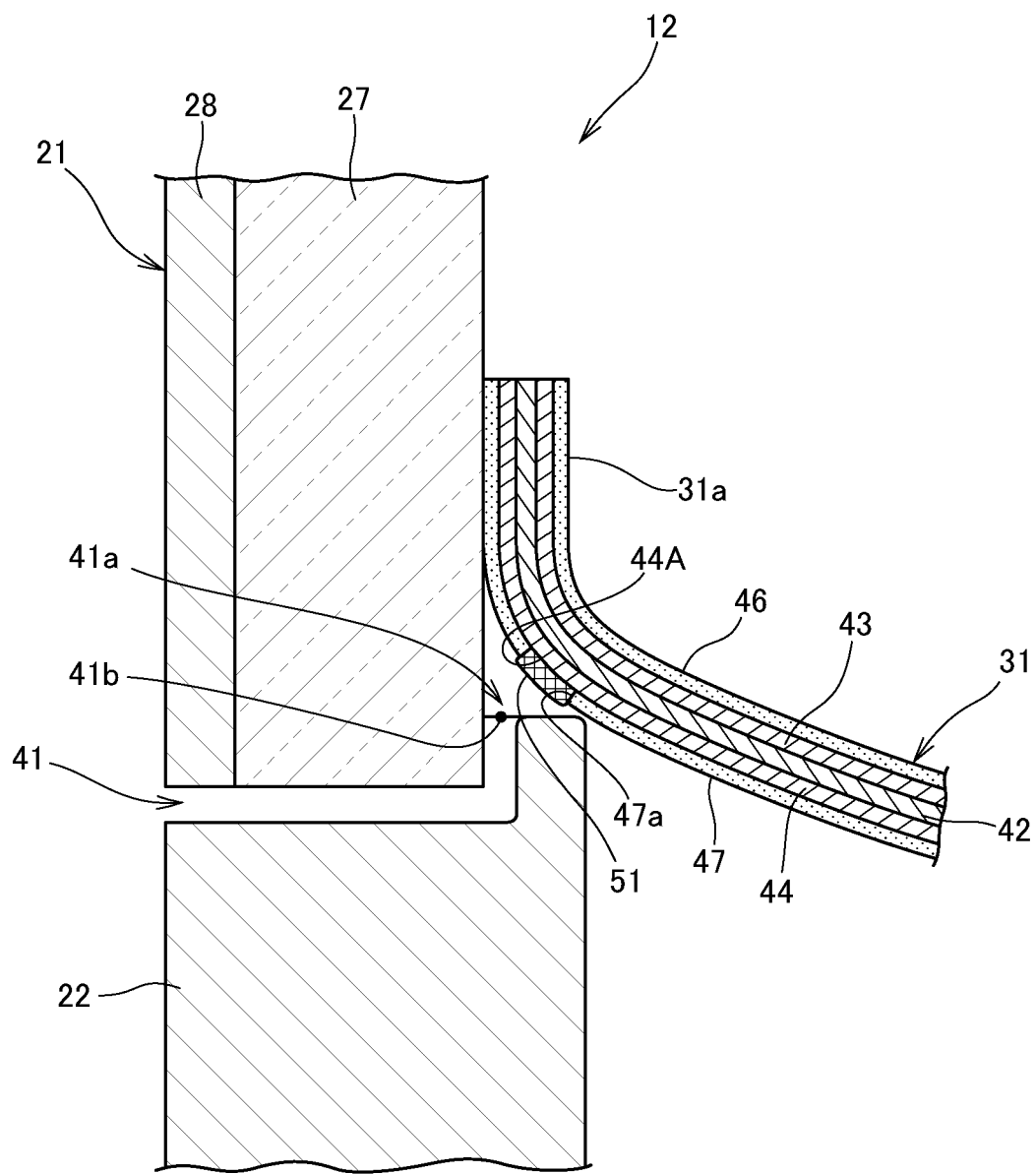
FIG. 4 is a cross-sectional view showing a touch panel, the flexible printed circuit board and their peripheries.

FIG. 4 is a cross-sectional view showing the touch panel 27, the flexible printed circuit board 31, and their peripheries.

Between the touch panel assembly 21 and the front casing 22 (or the touch panel 27 and the front casing 22), a gap 41 which is a part of a design is provided. The gap 41 can cause a risk that static electricity from the finger touching the touch panel 27 or the decorative panel 28 comes inside the display device 12, and it damages, for example, an IC or the like provided on the control printed circuit board 26 (see FIG. 3).

In the present embodiment, the flexible printed circuit board 31 is caused to have the following structure, and thereby, the aforementioned problem is solved.

Namely, the flexible printed circuit board 31 is constituted of a base material 42 forming a layer at the center of its thickness, conductor parts 43 and 44 constituted of copper foils or the like provided on both sides of the base material, and insulative coats 46 and 47 respectively covering the conductor parts 43 and 44.

The base material 42 is composed of a resin material such as polyimide. The conductor part 43 is a signal line allowing a signal to flow from the touch panel 27 to the control printed circuit board 26. The conductor part 44 is connected to the ground on the control printed circuit board 26 (see FIG. 3) side.

The insulative coats 46 and 47 are formed of colorless or colored, transparent polyimide films, solder resist films or the like.

The insulative coat 47 on the conductor part 44 side is cut away at the position closest to an opening 41a (specifically, a point 41b at the center of the opening 41a) inside the gap 41 to form a notch part 47a, and thus, an exposed part 44A externally exposed through the notch part 47a appears on the conductor part 44.

In this way, by forming the exposed part 44A of the conductor part 44, when static electricity comes into the front casing 22 through the gap 41, the exposed part 44A can serve as a lightning conductor to guide the static electricity to the exposed part 44A and allow it to escape to the ground. Since the exposed part 44A is provided at a position closer to the gap 41 than a place to which static electricity is possibly guided, such, for example, as the bonding part of the flexible printed circuit board 31 to the touch panel 27, static electricity can be not guided to the one end part 31*a* of the conductor part 43 or the like.

Moreover, the exposed part 44A may undergo plating with conductivity for preventing corrosion to form a coating part 51 (portion of cross-hatching). For the plating, gold plating or tin plating is preferable.

Since the coating part 51 has conductivity, similarly to the exposed part 44A, it is a part which can guide static electricity and is externally exposed, and the coating part 51 constitutes the exposed part.

FIGS. 5A and 5B are explanatory drawings showing positions and shapes of coating parts 51 and 55 in flexible printed circuit boards 31 and 35. FIG. 5A is a diagram showing the coating part 51 of a first embodiment. FIG. 5B is a diagram showing the coating part 55 of a second embodiment.

As shown in FIG. 5A, the notch part 47*a* is formed in such a way that the insulative coat 47 is peeled (stripped) off into a strip shape in the width direction across the whole width of the flexible printed circuit board 31. Thereby, the notch part 47*a* is formed along the direction of the gap 41 (see FIG. 4) extending, and the area of the exposed part 44A (see FIG. 4) (or coating part 51) is large. Hence, static electricity can be more easily guided.

As shown in FIG. 5B, the notch part 47*b* of the insulative coat 47 is formed into an oval shape extending in the width direction of the flexible printed circuit board 31. The coating part 55 constituted by plating is provided so as to cover the entirety of an exposed part (not shown) formed with the notch part 47*b* on the conductor part 44.

The shapes of the notch parts 47*a* and 47*b* (or coating parts 51 and 55) are not limited to the aforementioned shapes but may be circular, ellipsoidal, rectangular or in another shape. The point is that the conductor part 44 (or coating parts 51 and 55) is externally exposed and can take in static electricity.

As shown in FIG. 3 and FIG. 4 above, at the position corresponding to the gap 41, between two members (the front casing 22 and the touch panel assembly 21 (or touch panel 27)), appearing in the in-vehicle device 10 as an electronic device (specifically, the display device 12), the flexible printed circuit board 31 connected to the control printed circuit board 26 as a circuit board contained in the front casing 22 of the display device 12 is provided. The flexible printed circuit board 31 has two layers of the conductor parts 43 and 44, the surfaces of these conductor parts 43 and 44 are covered with the insulative coats 46 and 47, the exposed part 44A (or coating part 51 as the exposed part) through which the conductor part 44 is externally exposed by peeling off the insulative coat 47 at a portion opposing the gap 41 is formed, and the conductor part 44 having this exposed part 44A is grounded.

According to this configuration, static electricity coming into the front casing 22 through the gap 41 can be allowed to escape to the ground via the exposed part 44A (or coating part 51), and electrostatic surge can be prevented from occurring. Since static electricity is allowed to escape using the conductor part 44 of the existing flexible printed circuit board 31, a structure for preventing electrostatic surge or processes or spaces for providing the structure are not particularly needed but resistance against electrostatic surge can be improved while costs and processes are reduced and spaces are saved.

Moreover, since the exposed part 44A (or coating part 51) is provided at a position closer to the gap 41 than the bonding part, to the touch panel 27, which is provided to the end part of the flexible printed circuit board 31 or the similar part, by providing the exposed part 44A (or coating part 51) at a position closer to the gap 41, static electricity can easily reach the exposed part 44A (coating part 51) from the gap 41, and electrostatic surge can be prevented from occurring.

Moreover, since the exposed part 44A (or coating part 51) undergoes plating with conductivity, the plating can prevent corrosion of the exposed part 44A of the conductor part 44, and electrostatic surge can be prevented from occurring for a long time.

Moreover, as shown in FIG. 1, FIG. 2 and FIG. 3, since the two members are constituted of the front casing 22 constituting the front part of the in-vehicle electronic device and the touch panel 27 (or touch panel assembly 21) attached to this front casing 22, and the flexible printed circuit board 31 connects the touch panel 27 to the touch panel control circuit provided on the control printed circuit board 26, electrostatic surge due to static electricity flowing from an occupant operating the touch panel 27 can be prevented from occurring, and damage to an IC or the like of the touch panel control circuit can be prevented.

Each of the aforementioned embodiments simply shows an aspect of the present invention, and any modifications and applications thereof may occur without departing from the scope of the present invention.

REFERENCE SIGNS LIST

10 In-vehicle device (electronic device)
22 Front casing (casing, member)
26 Control printed circuit board (circuit board)
27 Touch panel
31 Flexible printed circuit board
41 Gap
43 and 44 Conductor parts
44A Exposed part
46 and 47 Insulative coats
51 and 55 Coating parts (exposed parts)

The invention claimed is:
1. An electrostatic surge prevention structure comprising:
a flexible printed circuit board connected to a circuit board contained in an electronic device is provided at a position corresponding to a gap, between two members, open to an exterior of the electronic device, appearing in the electronic device, wherein
the flexible printed circuit board has a base material, a first conductor part, and a second conductor part which are laminated in a thickness direction of the flexible printed circuit board,
the first conductor part forms a layer on one surface side of the base material, the second conductor part forms a layer on another surface side of the base material, and the base material forms a layer between the first conductor part and the second conductor part,
surfaces of the first conductor part and the second conductor part, which are an opposite surface side to the base material, are covered with insulative coats,
the first conductor part has an exposed part, in which the first conductor part is not covered with the insulative coat, to be grounded, and the second conductor part is a signal line allowing a signal,
in the flexible printed circuit board, the first conductor part is directed toward the gap and a width direction of the first conductor part is arranged along a direction of the gap with the exposed part formed at a portion facing the gap, and the exposed part of the first conductor part is formed along the direction of the gap extending in a strip shape across a width of the flexible printed circuit board.

2. The electrostatic surge prevention structure according to claim 1, wherein the exposed part is provided at a position closer to the gap than a connecting part provided in an end part of the flexible printed circuit board.

3. The electrostatic surge prevention structure according to claim 1, wherein the exposed part undergoes plating with conductivity.

4. The electrostatic surge prevention structure according to claim 1, wherein
- the two members are constituted of a front casing constituting a front part of the electronic device for being implemented in a vehicle, and a touch panel attached to the front casing, and
- the flexible printed circuit board connects the touch panel to a touch panel control circuit provided in the circuit board.

\* \* \* \* \*